United States Patent
Lopatin et al.

(10) Patent No.: US 7,205,233 B2
(45) Date of Patent: Apr. 17, 2007

(54) METHOD FOR FORMING COWRE ALLOYS BY ELECTROLESS DEPOSITION

(75) Inventors: Sergey Lopatin, Santa Clara, CA (US); Arulkumar Shanmugasundram, Sunnyvale, CA (US); Dmitry Lubomirsky, Cupertino, CA (US); Ian A. Pancham, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 502 days.

(21) Appl. No.: 10/703,769

(22) Filed: Nov. 7, 2003

(65) Prior Publication Data
US 2005/0101130 A1  May 12, 2005

(51) Int. Cl.
*H01L 21/28* (2006.01)

(52) U.S. Cl. ............ 438/678; 438/679; 438/618; 438/686

(58) Field of Classification Search .......... 438/678, 438/618, 686, 679
See application file for complete search history.

(56) References Cited

U.S. PATENT DOCUMENTS

| | | | |
|---|---|---|---|
| 2,369,620 A | 2/1945 | Sullivan et al. |
| 3,403,035 A | 9/1968 | Schneble et al. |
| 3,745,039 A | 7/1973 | Feldstein et al. |
| 3,937,857 A | 2/1976 | Brummett et al. |
| 4,006,047 A | 2/1977 | Brummett et al. |
| 4,150,177 A | 4/1979 | Guditz et al. |
| 4,232,060 A | 11/1980 | Mallory et al. |
| 4,234,628 A | 11/1980 | DuRose |
| 4,265,943 A | 5/1981 | Goldstein et al. |
| 4,364,803 A | 12/1982 | Nidola et al. |
| 4,366,035 A | 12/1982 | Wilkinson |
| 4,368,223 A | 1/1983 | Kobayashi et al. |
| 4,397,812 A | 8/1983 | Mallory, Jr. |
| 4,424,241 A | 1/1984 | Abys |
| 4,632,857 A | 12/1986 | Mallory, Jr. |
| 4,795,660 A | 1/1989 | Cooray et al. |
| 4,810,520 A | 3/1989 | Wu |
| 4,867,882 A | 9/1989 | O'Neill et al. |
| 5,055,199 A | 10/1991 | O'Neill et al. |
| 5,102,456 A | 4/1992 | Jagannathan et al. |
| 5,141,626 A | 8/1992 | Tanaka et al. |
| 5,147,692 A | 9/1992 | Bengston |
| 5,169,680 A | 12/1992 | Ting et al. |

(Continued)

FOREIGN PATENT DOCUMENTS

EP  0 329 406  8/1989

(Continued)

OTHER PUBLICATIONS

Hu, C.K., et al., Reduced Electromigration of Cu Wires by Surface Coating, Applied Physics Letters, vol. 81, No. 10, Sep. 2, 2002.

(Continued)

*Primary Examiner*—Thao P. Le
(74) *Attorney, Agent, or Firm*—Patterson & Sheridan, LLP.

(57) ABSTRACT

A method for fabricating a capping layer with enhanced barrier resistance to both copper and oxygen diffusion, comprises forming a capping layer on a conductive surface of an interconnect, wherein the capping layer comprises cobalt (Co), tungsten (W), rhenium (Re), and at least one of phosphorus (P) and boron (B). In an embodiment of the invention, forming the capping layer comprises exposing the conductive surface to an electroless capping solution comprising a cobalt source, a tungsten source, a rhenium source, and at least one of a phosphorus source and a boron source, and annealing the capping layer.

29 Claims, 6 Drawing Sheets

U.S. PATENT DOCUMENTS

| | | |
|---|---|---|
| 5,200,048 A | 4/1993 | Tanaka et al. |
| 5,203,911 A | 4/1993 | Sricharoenchaikit et al. |
| 5,212,138 A | 5/1993 | Krulik et al. |
| 5,234,628 A | 8/1993 | Trabitzsch et al. |
| 5,235,139 A | 8/1993 | Bengston et al. |
| 5,240,497 A | 8/1993 | Shacham et al. |
| 5,248,527 A | 9/1993 | Uchida et al. |
| 5,380,560 A | 1/1995 | Kaja et al. |
| 5,384,284 A | 1/1995 | Doan et al. |
| 5,415,890 A | 5/1995 | Kloiber et al. |
| 5,478,462 A | 12/1995 | Walsh |
| 5,510,216 A | 4/1996 | Calabrese et al. |
| 5,614,003 A | 3/1997 | Mallory et al. |
| 5,648,125 A | 7/1997 | Cane |
| 5,674,787 A | 10/1997 | Zhao et al. |
| 5,695,810 A | 12/1997 | Dubin et al. |
| 5,733,816 A | 3/1998 | Iyer et al. |
| 5,755,859 A | 5/1998 | Brusic et al. |
| 5,783,318 A * | 7/1998 | Biondo et al. ............ 428/680 |
| 5,824,599 A | 10/1998 | Schacham-Diamand et al. |
| 5,830,805 A | 11/1998 | Shacham-Diamand et al. |
| 5,843,538 A | 12/1998 | Ehrsam et al. |
| 5,846,598 A | 12/1998 | Semkow et al. |
| 5,882,433 A | 3/1999 | Ueno |
| 5,885,749 A | 3/1999 | Huggins et al. |
| 5,891,513 A | 4/1999 | Dubin et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,932,077 A | 8/1999 | Reynolds |
| 5,969,422 A | 10/1999 | Ting et al. |
| 6,010,962 A | 1/2000 | Liu et al. |
| 6,015,724 A | 1/2000 | Yamazaki |
| 6,015,747 A | 1/2000 | Lopatin et al. |
| 6,065,424 A | 5/2000 | Shacham-Diamand et al. |
| 6,077,780 A | 6/2000 | Dubin |
| 6,100,184 A | 8/2000 | Zhao et al. |
| 6,107,199 A | 8/2000 | Allen et al. |
| 6,110,530 A | 8/2000 | Chen et al. |
| 6,113,771 A | 9/2000 | Landau et al. |
| 6,136,163 A | 10/2000 | Cheung et al. |
| 6,136,693 A | 10/2000 | Chan et al. |
| 6,140,234 A | 10/2000 | Uzoh et al. |
| 6,144,096 A | 11/2000 | Lopatin |
| 6,144,099 A | 11/2000 | Lopatin et al. |
| 6,153,935 A | 11/2000 | Edelstein et al. |
| 6,165,912 A | 12/2000 | McConnell et al. |
| 6,171,661 B1 | 1/2001 | Zheng et al. |
| 6,174,812 B1 | 1/2001 | Hsiung et al. |
| 6,180,523 B1 | 1/2001 | Lee et al. |
| 6,197,181 B1 | 3/2001 | Chen |
| 6,197,364 B1 | 3/2001 | Paunovic et al. |
| 6,197,688 B1 | 3/2001 | Simpson |
| 6,228,233 B1 | 5/2001 | Lakshmikanthan et al. |
| 6,242,349 B1 | 6/2001 | Nogami et al. |
| 6,245,670 B1 | 6/2001 | Cheung et al. |
| 6,251,236 B1 | 6/2001 | Stevens |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,258,707 B1 | 7/2001 | Uzoh |
| 6,261,637 B1 | 7/2001 | Oberle |
| 6,277,263 B1 | 8/2001 | Chen |
| 6,290,833 B1 | 9/2001 | Chen |
| 6,291,082 B1 | 9/2001 | Lopatin |
| 6,291,348 B1 | 9/2001 | Lopatin et al. |
| 6,309,969 B1 | 10/2001 | Oskam et al. |
| 6,319,387 B1 | 11/2001 | Krishnamoorthy et al. |
| 6,323,128 B1 | 11/2001 | Sambucetti et al. |
| 6,342,733 B1 | 1/2002 | Hu et al. |
| 6,344,125 B1 | 2/2002 | Locke et al. |
| 6,344,410 B1 | 2/2002 | Lopatin et al. |
| 6,350,364 B1 | 2/2002 | Jang |
| 6,416,647 B1 | 7/2002 | Dordi et al. |
| 6,428,673 B1 | 8/2002 | Ritzdorf et al. |
| 6,431,190 B1 | 8/2002 | Oka et al. |
| 6,432,819 B1 | 8/2002 | Pavate et al. |
| 6,432,821 B1 | 8/2002 | Dubin et al. |
| 6,436,267 B1 | 8/2002 | Carl et al. |
| 6,436,816 B1 | 8/2002 | Lee et al. |
| 6,441,492 B1 | 8/2002 | Cunningham |
| 6,486,055 B1 | 11/2002 | Jung et al. |
| 6,503,834 B1 | 1/2003 | Chen et al. |
| 6,516,815 B1 | 2/2003 | Stevens et al. |
| 6,517,894 B1 | 2/2003 | Hongo et al. |
| 6,528,409 B1 * | 3/2003 | Lopatin et al. ............ 438/618 |
| 6,544,399 B1 | 4/2003 | Landau et al. |
| 6,551,483 B1 | 4/2003 | Mayer et al. |
| 6,565,729 B2 | 5/2003 | Chen et al. |
| 6,573,606 B2 | 6/2003 | Sambucetti et al. |
| 6,588,437 B1 | 7/2003 | Higashi |
| 6,596,151 B2 | 7/2003 | Landau et al. |
| 6,605,874 B2 | 8/2003 | Leu et al. |
| 6,616,772 B2 | 9/2003 | de Larios et al. |
| 6,616,967 B1 | 9/2003 | Test |
| 6,620,719 B1 | 9/2003 | Andry et al. |
| 6,632,345 B1 | 10/2003 | Chen |
| 6,638,410 B2 | 10/2003 | Chen et al. |
| 6,645,550 B1 | 11/2003 | Cheung et al. |
| 6,645,567 B2 | 11/2003 | Chebiam et al. |
| 6,680,540 B2 * | 1/2004 | Nakano et al. ............ 257/758 |
| 6,709,563 B2 | 3/2004 | Nagai et al. |
| 6,717,189 B2 | 4/2004 | Inoue et al. |
| 6,743,473 B1 | 6/2004 | Parkhe et al. |
| 6,756,682 B2 | 6/2004 | Sinha et al. |
| 6,787,450 B2 | 9/2004 | Sinha et al. |
| 6,794,288 B1 | 9/2004 | Kolics et al. |
| 6,797,312 B2 | 9/2004 | Kong et al. |
| 6,821,909 B2 | 11/2004 | Ramanathan et al. |
| 6,824,612 B2 | 11/2004 | Stevens et al. |
| 6,824,666 B2 | 11/2004 | Gandikota et al. |
| 6,852,618 B2 | 2/2005 | Chopra |
| 6,924,232 B2 * | 8/2005 | Mathew et al. ............ 438/678 |
| 2001/0042689 A1 | 11/2001 | Chen |
| 2002/0027261 A1 | 3/2002 | Besser et al. |
| 2002/0098711 A1 | 7/2002 | Klein |
| 2002/0098981 A1 | 7/2002 | Hu et al. |
| 2002/0182385 A1 | 12/2002 | Senkevich et al. |
| 2003/0010645 A1 | 1/2003 | Ting et al. |
| 2003/0075808 A1 | 4/2003 | Inoue et al. |
| 2003/0111729 A1 | 6/2003 | Leu et al. |
| 2003/0113576 A1 | 6/2003 | Chebiam et al. |
| 2003/0116439 A1 | 6/2003 | Seo et al. |
| 2003/0141018 A1 | 7/2003 | Stevens et al. |
| 2003/0155247 A1 | 8/2003 | Miura et al. |
| 2003/0181040 A1 | 9/2003 | Ivanov et al. |
| 2003/0186535 A1 | 10/2003 | Wong et al. |
| 2004/0035316 A1 | 2/2004 | Chebiam et al. |
| 2004/0038073 A1 | 2/2004 | Chebiam et al. |
| 2004/0065540 A1 | 4/2004 | Mayer et al. |
| 2004/0072419 A1 | 4/2004 | Baskaran et al. |
| 2004/0096592 A1 | 5/2004 | Chebiam et al. |
| 2004/0105934 A1 | 6/2004 | Chang et al. |
| 2004/0113277 A1 | 6/2004 | Chiras et al. |
| 2004/0175509 A1 | 9/2004 | Kolics et al. |
| 2004/0241321 A1 | 12/2004 | Ganguli et al. |
| 2004/0253826 A1 * | 12/2004 | Ivanov et al. ............ 438/710 |
| 2004/0262772 A1 | 12/2004 | Ramanathan et al. |
| 2004/0265501 A1 | 12/2004 | Choi et al. |
| 2005/0006245 A1 | 1/2005 | Sun et al. |
| 2005/0090098 A1 | 4/2005 | Dubin et al. |
| 2005/0118807 A1 | 6/2005 | Kim et al. |
| 2005/0124154 A1 | 6/2005 | Park et al. |

| | | | |
|---|---|---|---|
| 2005/0136185 | A1 | 6/2005 | Ramanathan et al. |
| 2005/0212058 | A1 | 9/2005 | Huang et al. |
| 2005/0212139 | A1 | 9/2005 | Leinikka et al. |
| 2005/0238808 | A1 | 10/2005 | Gatineau et al. |
| 2005/0258499 | A1 | 11/2005 | Huang et al. |

FOREIGN PATENT DOCUMENTS

| | | |
|---|---|---|
| EP | 0 475 567 | 3/1992 |
| EP | 0 913 498 | 5/1999 |
| GB | 2285174 | 6/1995 |
| JP | 59215473 A | 12/1984 |
| JP | 7-297543 | 11/1995 |
| JP | 11-124682 | 5/1999 |
| WO | WO 88/08887 | 11/1988 |

OTHER PUBLICATIONS

Dubin, et al. "Selective and Blanket Electroless Copper Deposition for Ultralarge Scale integration," J. Electrochem. Soc., vol. 144, No. 3, Mar. 1997, pp. 898-908.

Eze, et al. "Chemical-bath-deposited cobalt sulphide films: preparation effects," Materials Chemistry and Physics, 47 (1997), pp. 31-36.

Eze "Electroless deposition of CoO thin films," J. Phys. D. Appl. Phys. 32 (1999), pp. 533-540.

Georgiou, et al. "Thick Selective Electroless-Plated Cobalt-Nickel Alloy Contacts to $CoSi_2$," J. Electrochem. Soc., vol. 138, No. 7, Jul. 1991, pp. 2061-2069.

Lin, et al. "Manufacturing of Cu/Electroless Nickel/Sn-Pb Flip Chip Solder Bumps," IEEE Transactions on Advanced Packaging, vol. 22, No. 4 (Nov. 1999), pp. 575-579.

Lopatin, et al. "Thin Electroless barrier for copper films," Part of the SPIE Conference of Multilevel interconnect technology II, SPIE vol. 3508 (1998), pp. 65-77.

Pearlstein, et al. "Electroless Cobalt Deposition from Acid Baths," J. Electrochem. Soc.: Electrochemical Science and Technology, Aug. 1974, vol. 121, No. 8, pp. 1023-1028.

Pearlstein "Electroless Plating," J. Res. Natl. Bur. Stan., Ch. 31 (1963), pp. 710-747.

Saito, et al. "Electroless deposition of Ni-B, Co-B and Ni-Co-B alloy using dimethylamineborane as a reducing agent," J. of Appl. Electrochemistry 28 (1998), pp. 559-563.

Shacham-Diamand, et al. "Copper electroless deposition technology for ultra-large-scale-integration (ULS) metallization," Microelectric Engineering 33 (1997), pp. 47-58.

Shacham-Diamand, et al. "Electrochemically deposited thin film alloys for ULSI and MEMS applications," Microelectronic Engineering 50 (2000), pp. 525-531.

Shacham-Diamand, et al. "Electroless copper deposition for ULSI," Thin Solid Films 262 (1995), pp. 93-103.

Shacham-Diamand, et al. "High Aspect Ratio Quarter-Micron Electroless Copper Integrated Technology," Microelectronic Engineering 37/38 (1997), pp. 77-88.

Shacham-Diamand, et al. "Integrated electroless metallization for ULSI," Electrochimica Acta 44 (1999), pp. 3639-3649.

Shacham-Diamand, et al. "Material properties of electroless 100-200 nm thick CoWP films," Electrochemical Society Proceedings, vol. 99-34, pp. 102-110.

Ting, et al. "Selective Electroless Metal Deposition for Via Hole Filling in VLSI Multilevel Interconnection Structures," J. Electrochem. Soc., vol. 136, No. 2, Feb. 1989, pp. 462-465.

Sergey Lopatin, "Electrochemical Metallization Of Nanostructures: Integrated Circuits and Micro-Electro-Mechanical Systems", Recent Res. Devel. Electrochem, 6(2003): 57-100, ISBN: 81-7895-107-X.

* cited by examiner

METHOD FOR FORMING COWRE ALLOYS BY ELECTROLESS DEPOSITION

BACKGROUND OF THE INVENTION

1. Field of the Invention

Embodiments of the invention generally relate to methods for depositing capping layers within a semiconductor feature, and more particularly for electrolessly depositing doped metal alloys on conductive surfaces.

2. Description of the Related Art

Recent improvements in circuitry of ultra-large scale integration (ULSI) on substrates indicate that future generations of integrated circuit (IC) semiconductor devices will require smaller multi-level metallization. The multilevel interconnects that lie at the heart of this technology require planarization of interconnects formed in high aspect ratio features, including contacts, vias, lines and other features. Reliable formation of these interconnects is very important to the success of ULSI and to the continued effort to increase circuit density by decreasing the dimensions of semiconductor features and decreasing the widths of interconnects (e.g., lines) to 0.13 μm and less.

Currently, copper and its alloys have become the metals of choice for sub-micron interconnect technology because copper (Cu) has a lower resistivity than aluminum (Al) (i.e., 1.67 μΩ-cm for Cu as compared to 3.1 μΩ-cm for Al), a higher current carrying capacity, and significantly higher electromigration resistance. These characteristics are important for supporting the higher current densities experienced at high levels of integration and increased device speed. Further, copper has a good thermal conductivity and is available in a highly pure state.

However, despite attributes Cu has over Al, as Cu interconnect lines decrease in dimension, the Cu interconnect is increasingly susceptible to diffusion and electromigration failure. Therefore, a liner barrier layer is used to encapsulate the Cu interconnect to prevent diffusion of Cu to adjacent dielectric layers. Also, Cu readily forms copper oxide when exposed to oxygen containing environments. Copper oxide formation increases the resistance of the Cu interconnect and reduces the reliability of the overall circuit.

One solution is to selectively deposit a metal alloy on the Cu interconnect which provides a barrier resistance to copper diffusion, electromigration and oxidation. Copper electromigration in damascene interconnections can be significantly reduced by replacing the top Cu/dielectric interface with a Cu/metal interface by depositing a thin metal capping layer of, for example, cobalt tungsten phosphorus (CoWP), cobalt tin phosphorus (CoSnP), and cobalt tungsten phosphorus boron (CoWPB), onto the surface of the Cu interconnect. In addition, for increasing adhesion and selectively depositing the capping layer over the Cu interconnect, an activation layer such as palladium (Pd) or platinum (Pt) may be deposited on the surface of the Cu interconnection prior to depositing the capping layer.

However, with the increasing demand on IC performance and reliability, the resistance-capacitance (RC) delay constant of metal/dielectric systems (e.g., Cu/SiO$_2$, Cu/SiCOH, Cu/SiCO, Cu/organic low k dielectric), due to the inherent resistance (R) and capacitance (C) of the materials used, will necessarily decrease to support future requirements. The anticipated RC delay constant reduction of about 30% to 50% of interconnects adjacent very low k dielectric materials having a low k constant less than about 2.5, including air gap technology (low k constant=1), requires metal capping layers to provide improved barrier resistance to both oxygen diffusion and copper diffusion. In addition, high processing temperatures reaching 400° C. to 450° C. for periods of about 8 hours during back-end-of-the-line (BEOL) layer processing and chip packaging lead to oxidation of Co alloys and Pd of the thin capping layers. In particular, oxidation is particularly detrimental in thinner capping layers having thicknesses of less than about 150 Å, for example a 70 Å layer of COWP or COWPB adjacent oxygen sources in the surrounding dielectric and/or air.

Therefore, there is a need for a method to forming a capping layer on a conductive surface of a semiconductor feature exhibiting improved barrier properties against oxygen and copper diffusion while maintaining low electrical resistance and excellent adhesion to the conductive surface.

SUMMARY OF THE INVENTION

The invention generally provides a method for forming a capping layer exhibiting enhanced barrier resistance to both copper and oxygen diffusion for a metal interconnect in a semiconductor device comprising, forming a capping layer on a conductive surface of the metal interconnect, wherein the capping layer comprises cobalt (Co), tungsten (W), rhenium (Re), and at least one of phosphorus (P) and boron (B), and annealing the capping layer. In another embodiment, the capping layer may further comprise at least one of calcium (Ca), aluminum (Al), nickel (Ni), and molybdenum (Mo).

In another embodiment, the invention generally provides a method for forming a multilayer capping layer exhibiting enhanced barrier resistance to both copper and oxygen diffusion for a metal interconnect in a semiconductor device comprising, forming multiple layers and annealing the layers to form an interface layer, such that the interface layer comprises Co, W, Re, and at least one of P and B. In another embodiment, the multilayer capping layer may further comprise at least one of Ca, Al, Ni, and Mo.

In another embodiment, the invention generally provides a process of fabricating a capping layer exhibiting enhanced barrier resistance to both copper and oxygen diffusion on a conductive surface, comprising pre-cleaning the conductive surface, depositing an activation layer, electrolessly depositing a capping layer comprising Co, W, Re, and at least one of P and B, and annealing the capping layer.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

The words and phrases used herein should be given their ordinary and customary meaning in the art to one skilled in the art unless otherwise further defined. Electroless deposition is broadly defined herein as deposition of a conductive material generally provided as charged ions in a bath over a catalytically active surface to deposit the conductive material by chemical reduction in the absence of an external electric current.

Figure 1A:
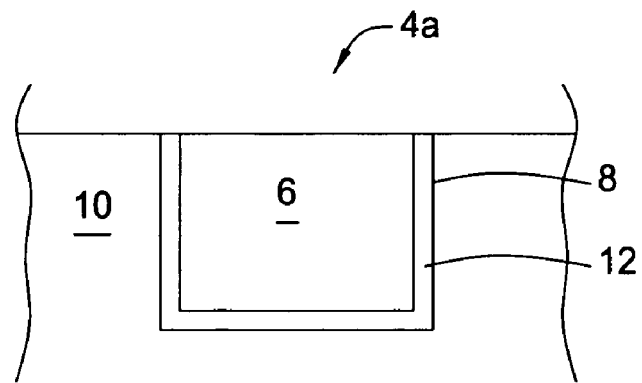
FIGS. 1A, 1B, and 1C schematically depict cross-sectional views for forming a capping layer, according to an embodiment of the invention.

FIG. 1A shows a cross-sectional view of an interconnect 4a containing a conductive fill material 6 disposed within an interconnect opening 8 formed in a low-k dielectric material 10. Interconnect 4a, as well as other semiconductor features, are disposed on a substrate surface. Substrate surfaces on which embodiments of the invention may be useful include, but are not limited to, crystalline silicon (e.g., Si<100> or Si<111>), silicon oxide, silicon germanium, doped or undoped polysilicon, doped or undoped silicon, and silicon nitride. Other substrate surfaces include bare silicon wafers, or substrates having conductive or non-conductive layers thereon, such as layers comprising materials having dielectric, conductive, or barrier properties, including aluminum oxide and polysilicon, and pretreated surfaces. Pretreatment of surfaces may include one or more of polishing (e.g., electro-polishing), patterning, etching, reduction, oxidation, hydroxylation, annealing and baking. Substrate surface is used herein to include any semiconductor feature thereon, including the exposed surfaces of interconnect features, such as the top, bottom, and/or wall surfaces of vias, lines, dual damascenes, contact holes and the like.

Trenches and holes are formed in the low-k dielectric material 10 for forming semiconductor features throughout the dielectric layer (not shown). A liner barrier layer 12 is used to separate the low-k dielectric material 10 from the conductive fill material 6. Liner barrier layers include materials such as titanium, titanium nitride, tantalum, tantalum nitride, tantalum silicon nitride, tungsten nitride, silicon nitride, and combinations thereof which are usually deposited by plasma vapor deposition (PVD), atomic layer deposition (ALD), and chemical vapor deposition (CVD) techniques. Conductive fill material 6 includes metals such as copper (Cu), aluminum (Al), tungsten (W), and various alloys of the aforementioned metals, and preferably, the conductive fill material 6 is Cu or Cu alloy for forming the interconnect 4a structure (e.g., line or via). The conductive fill material 6 is generally deposited by a deposition process, such as electroplating, electroless plating, CVD, ALD, and/or combinations thereof. A layer of conductive fill material is deposited and then polished or leveled, by techniques such as electrochemical polishing and chemical mechanical polishing (CMP), to form the interconnect 4a structure depicted in FIG. 1A.

Figure 1B:
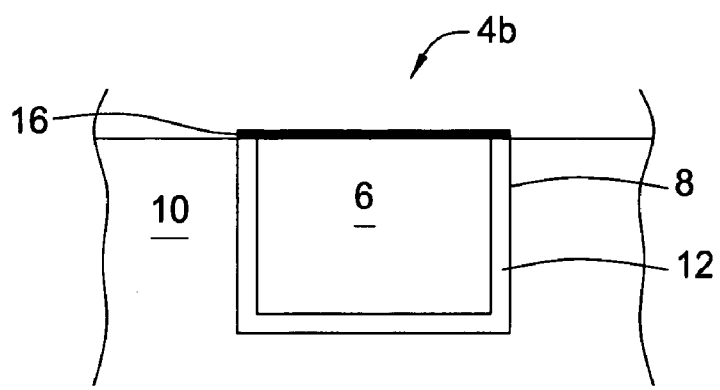
Figure 1C:
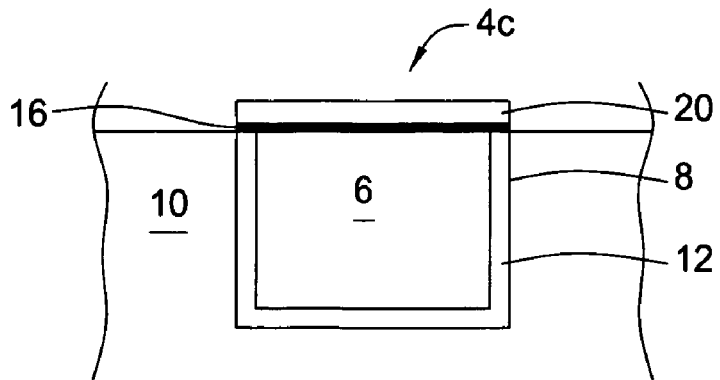
Figure 2A:
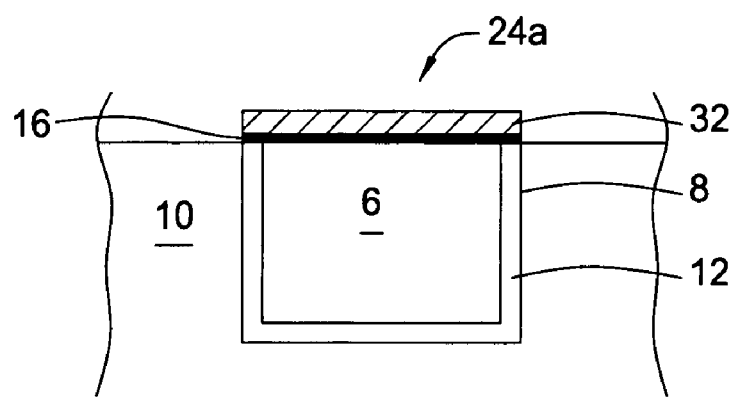
FIGS. 2A, 2B, and 2C schematically depict cross-sectional views for forming a two-layer capping layer, according to another embodiment of the invention.
Figure 2B:
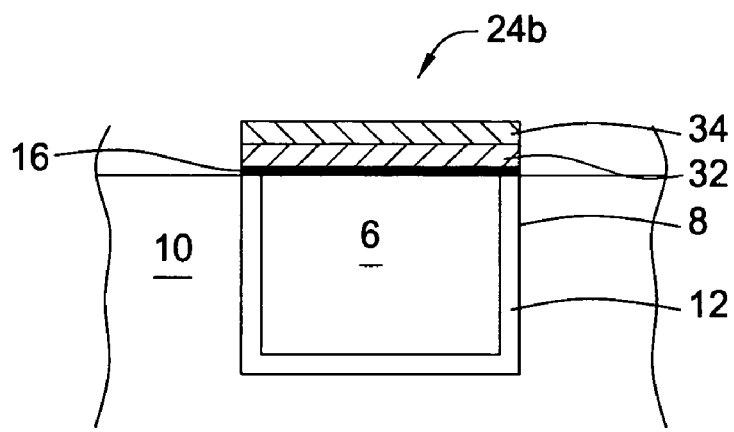
Figure 2C:
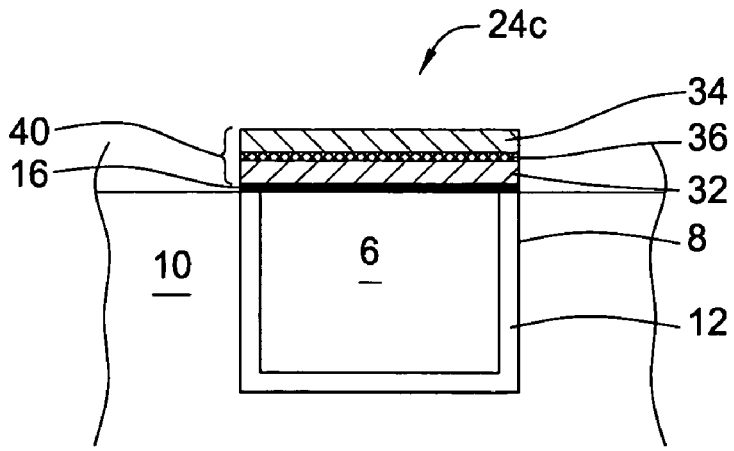
Figure 3A:
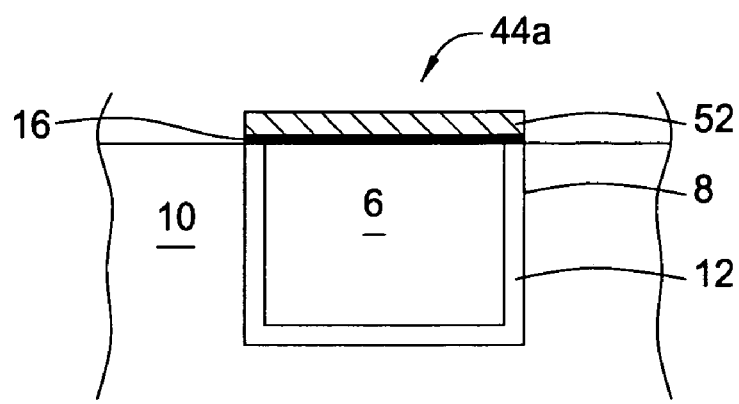
FIGS. 3A, 3B, and 3C schematically depict cross-sectional views for forming a two-layer capping layer, according to another embodiment of the invention.
Figure 3B:
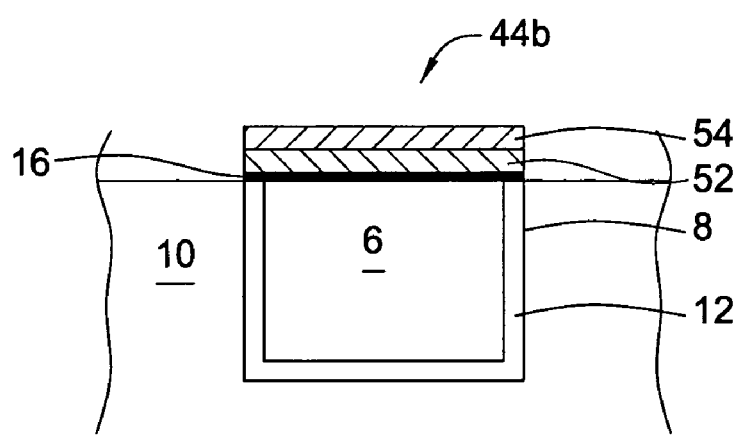
Figure 3C:
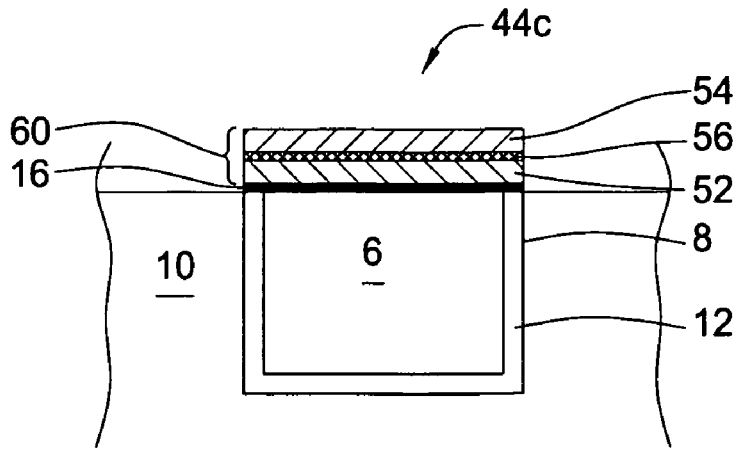
Figure 4:
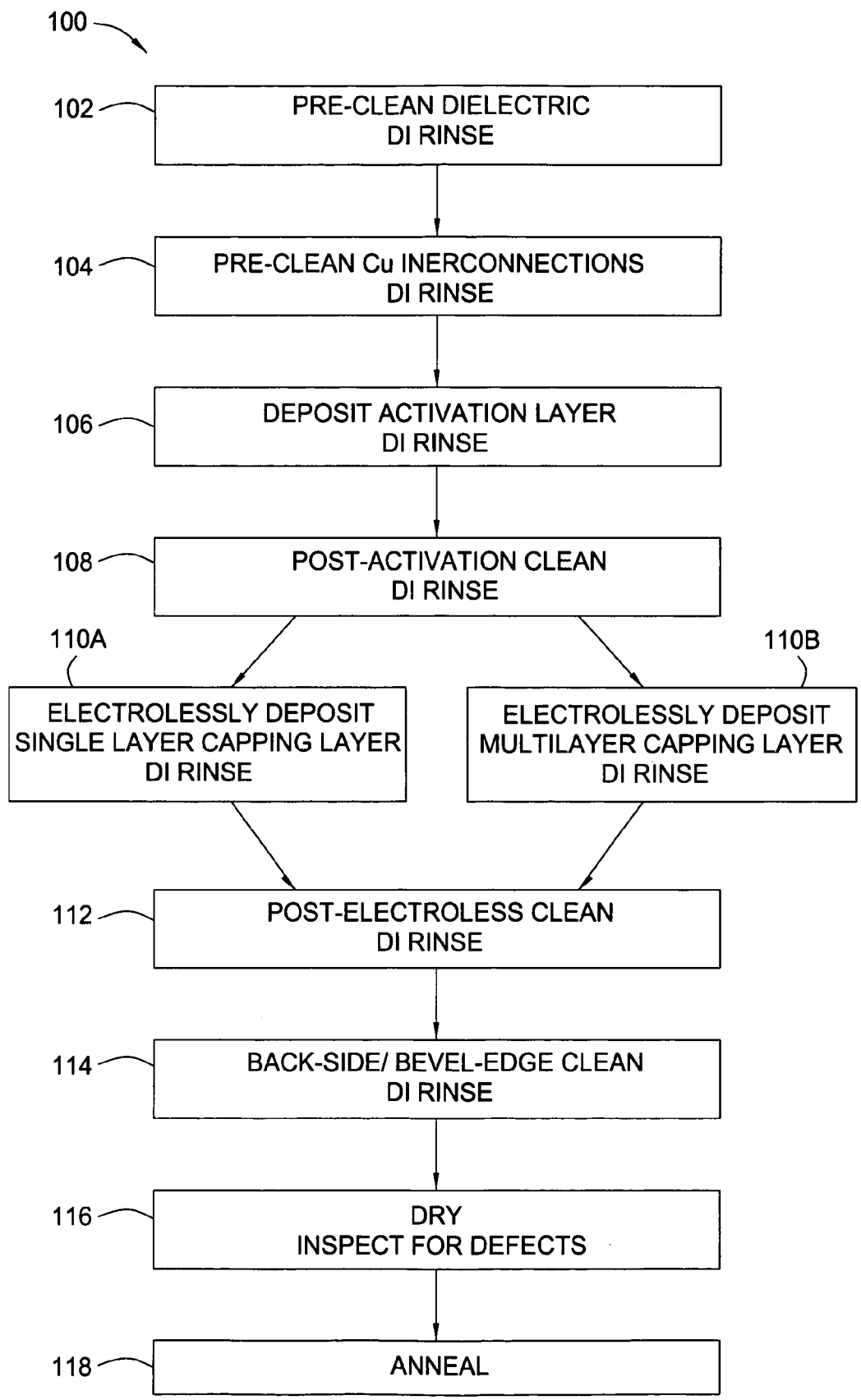
FIG. 4 is a flow chart of steps for forming a capping layer over an interconnect, in accordance with various embodiments of the invention.

Process 100, shown in FIG. 4, is followed to deposit a capping layer on a conductive surface in accordance with various embodiments of the invention, as illustrated in FIGS. 1C, 2C, and 3C. Forming a capping layer of the invention generally begins with pre-cleaning the dielectric at step 102 of FIG. 4. The substrate surface is cleaned in a pre-clean aqueous solution comprising benzotriazole (BTA), citric acid, hydrofluoric acid (HF), and water for about 10 seconds to about 30 seconds, preferably about 15 seconds. In addition, antifungal compounds are preferably added to the pre-clean aqueous solution. For example, the pre-clean solution may comprise BTA having a concentration of about 0.025 g/L, citric acid (100%) having a concentration of about 20 g/L, HF (48–49%) having a concentration of about 10 mL/L, deionized (DI) water, and an antifungal additive.

Following pre-cleaning the dielectric, the substrate surface is rinsed. The rinse step includes washing any remaining pre-cleaning solution and/or contaminants from the surface with DI water. The substrate will be rinsed for a period from about 5 seconds to about 60 seconds, preferably for about 15 seconds.

Following pre-cleaning and rinsing the dielectric, the exposed Cu surfaces are cleaned in a pre-clean Cu interconnections step shown at step 104. The exposed Cu surface is cleaned in a pre-clean Cu solution typically comprising sulfuric acid ($H_2SO_4$), hydrochloric acid (HCl), a surfactant, and water for about 5 seconds to about 60 seconds, preferably from about 30 seconds to about 45 seconds. For example, a pre-cleaning solution may comprise $H_2SO_4$ (96%–98%) having a concentration of about 5 mL/L to about 20 mL/L, HCl (36%) having a concentration of about 10 mL/L to about 30 mL/L, and a surfactant Rhodafac® RE-610 (available from Rhodia Group) in a concentration in the range from about 0.005 g/L to about 0.4 g/L, preferably about 0.02 g/L, and DI water. The exposed Cu surfaces are cleaned in the pre-clean Cu solution for about 20 seconds to about 60 seconds, preferably for about 30 seconds to about 45 seconds.

After pre-cleaning the Cu surfaces, the substrate surface is rinsed. The rinse step includes washing any remaining pre-cleaning Cu solution and/or contaminants from the surface with DI water. The substrate will be rinsed for a period from about 5 seconds to about 60 seconds, preferably for about 15 seconds.

In another embodiment of the invention, prior to depositing a capping layer of the invention, an activation layer 16 is deposited on the exposed Cu surfaces at step 106, as illustrated by interconnect 4b depicted in FIG. 1B. The activation layer may comprise palladium (Pd), silver (Ag), cobalt (Co), gold (Au), nickel (Ni), zinc (Zn), platinum (Pt), or tin (Sn). In an example, the activation layer comprises Pd for selective activation of the exposed Cu surfaces. The Pd activation layer is formed by exposing the Cu surfaces to a Pd activation solution typically comprising a Pd source, an acid, and water for about 5 seconds to about 60 seconds, preferably about 20 seconds. For example, the Pd activation solution may comprise 3% Shipley Activator 472 (available from Shipley Company, L.L.C. of Marlborough, Mass.) having a concentration of about 30 mL/L, HF (49%) having a concentration of about 10 mL/L, and DI water. In another example, the Pd activation solution may comprise $PdCl_2$ (5%), $PdSO_4$, Pd acetate, HCl (36%), $H_2SO_4$ (96%–98%), HF (48%), and DI water.

After depositing the activation layer, the substrate surface is rinsed in DI water to remove any remaining activation solution and/or contaminants from the surface of the substrate. The substrate will be rinsed for a period from about 5 seconds to about 60 seconds, preferably from about 3 seconds to about 5 seconds.

At step 108, the substrate surface is cleaned in a post activation clean solution comprising a base, such as tetramethylammonium hydroxide (TMAH) and/or ammonium hydroxide ($NH_4OH$), citric acid, methyl 4-hydroxy benzoic acid, a surfactant, and water for about 5 seconds to about 60 seconds, preferably from about 15 seconds to about 30 seconds. For example, the post activation clean solution may comprise from about 15 g/L to about 30 g/L TMAH (25%), from about 20 g/L to about 25 g/L $NH_4OH$, from about 3 g/L to about 10 g/L citric acid (100%), from about 0.01 g/L to about 0.1 g/L methyl 4-hydroxy benzoic acid, from about 0.01 g/L to about 0.02 g/L Rhodafac® RE-610, and DI water.

After post activation cleaning, the substrate surface is rinsed in DI water. The rinse step includes washing any remaining post activation clean solution and/or contaminants from the surface with DI water. The substrate will be rinsed for a period from about 1 second to about 60 seconds, preferably from about 3 seconds to about 5 seconds.

In steps 110A and 110B, after post activation cleaning and rinsing, a capping layer 20, 40, or 60 is electrolessly deposited on the activation layer 16, as illustrated by interconnects 4c, 24c, and 44c in FIGS. 1C, 2C, and 3C, respectively, according to various embodiments of the invention. Capping layers 20, 40, and 60 generally comprise cobalt (Co), tungsten (W), rhenium (Re), and at least one of phosphorus (P) and boron (B). The introduction of a small amount of Re provides a microcrystalline capping layer with stuffed grain boundaries by the additional Re alloying atoms. The Re in the capping layer increases the density of the amorphous-like film for decreasing oxygen and copper diffusion. Increasing the concentration of P in the capping layer forms quasi-amorphous deposits for enhancing electromigration resistance. The capping layer may be one continuous capping layer 20 of a capping alloy of the invention, as illustrated in FIG. 1C, but is generally comprised of multiple layers comprising at least one layer of a capping alloy of the invention, as illustrated by the multilayer capping layers 40 and 60 depicted in FIGS. 2C and 3C, respectively. The multiple layers may be two or more layers. An advantage of the multilayer capping layer configuration is the multilayer capping layer provides interfaces, between the multiple layers, which further inhibit copper diffusion. In another embodiment, capping layers 20, 40, and 60 could be deposited directly onto the conductive fill material 6 without an intermediate activation layer.

Capping layers 20, 40, and 60 may include a variety of capping alloys comprising Co, W, Re, and at least one of P and B, wherein the elemental ratios of each alloy may be varied. Generally, the CoWReP, CoWReB, and CoWRePB capping alloys comprise a cobalt concentration in a range from about 50 at. % to about 98 at. %, preferably from about 70 at. % to about 85 at. %, a tungsten concentration in a range from about 1 at. % to about 6 at. %, preferably from about 2 at. % to about 4 at. %, a rhenium concentration of about 0.1 at. % to about 10 at. %, preferably from about 0.5 at. % to about 4 at. %, a phosphorus concentration in a range from about 0 at. % to about 20 at. %, preferably from about 8 at. % to about 15 at. %, and a boron concentration in a range from about 0 at. % to about 6 at. %, preferably from about 3 at. % to about 4 at. %. The CoWReP, CoWReB, and CoWRePB capping alloys may optionally further include calcium (Ca). Generally, the calcium concentration is in a range from about 0 at. % to about 4 at. %, preferably from about 2 at. % to about 3 at. %. Examples of capping alloys include CoWRePCa, CoWReBCa, and CoWRePBCa, wherein the elemental ratios of each alloy may be varied. Other metallic additives that may be introduced into the capping alloy include Al, Ni, and Mo to slow oxidation of the capping layer as well as decrease Cu diffusion. When incorporated in the capping alloy, Al, Ni, and Mo may increase the density of the film.

FIGS. 1A–1C schematically depict cross-sectional views for forming a capping layer 20 according to an embodiment of the invention. At step 110A, the capping layer 20 is electrolessly deposited by exposing the conductive surface of the activation layer 16 to an electroless deposition capping solution comprising Co, W, Re, and at least one of P and B, as illustrated in FIGS. 1B and 1C. Other capping alloys may further comprise other additives, such as Ca, Al, Ni, and Mo. A variety of capping layer compositions may be achieved by the selection of the elemental source and manipulating the concentrations of the source in the capping solution. Alternatively, in another embodiment of the invention, the capping layer 20 may be deposited on the conductive fill material 6, without an activation layer. However, preferably an activation layer is deposited prior to depositing the capping layer 20.

In a preferred embodiment, the electroless deposition capping solution is an aqueous solution (DI water) comprising a Co source, a W source, a Re source, and a P source and/or B source to form a capping layer 20 having a composition of CoWReP or CoWReB or CoWRePB, wherein Re has a concentration from about 0.1 at. % to about 8 at. %, preferably from about 0.5 at. % to about 4 at. % of the capping layer composition (i.e., capping alloy). The electroless solution may include Co ions, W ions, Re ions, and P or B ions from a wide variety of sources. The electroless capping solution may also include a Ca source, an Al source, a Ni source, and/or a Mo source. The electroless deposition solution also includes a complexing agent, a buffering compound or pH adjuster, and may optionally include antifungal or antibacterial compounds, surfactant, and additives such as accelerators and/or stabilizers.

Cobalt sources include cobalt chlorides, for example $CoCl_2.6H_2O$, and cobalt sulfates, for example $CoSO_4.7H_2O$, derivatives thereof, and combinations thereof. The cobalt chloride and/or cobalt sulfate typically has a concentration in the range from about 1 g/L to about 100 g/L, preferably from about 15 g/L to about 35 g/L of the capping solution.

Tungsten sources include calcium tungstate ($CaWO_4$), ammonium tungstate (($NH_4)_2WO_4$), tungstic acid ($H_2WO_4$), derivatives thereof, and combinations thereof, preferably calcium tungstate having a concentration in the range from about 0.01 g/L to about 50 g/L, preferably from about 5 g/L to about 15 g/L of the capping solution. Also, calcium tungstate is a calcium source, which may be a desired component of the capping alloy.

Phosphorus sources include hypophosphorus acid ($H_3PO_2$), calcium hypophosphates such as $Ca(H_2PO_4)_2$, $CaHPO_4$ and $Ca_{10}(OH)_2(PO_4)_6$, ammonium hypophosphite (($NH_4)_3PO_2$), hydrates thereof, derivatives thereof, and combinations thereof. The phosphorus source has a concentration in the range from about 5 g/L to about 80 g/L, preferably from about 10 g/L to about 50 g/L of the capping solution. The calcium hypophosphite, as well as the other Ca containing phosphorus sources, provide a calcium source which may be a desired component of the capping alloy. As an alternative to phosphorus, or in combination with phosphorus, boron may be added to the capping solution. Boron sources include dimethylamine-borane (DMAB) complex $(CH_3)_2NHoBH_3$ having a concentration of about 1 g/L to about 50 g/L, preferably from about 5 g/L to about 15 g/L.

Rhenium sources include rhenium salts, rhenium oxides, rhenium metal powders, and combinations thereof. For example, Re salts may include $ReCl_3$, $ReCl_5$, $Re(CO)_5Br$, and $Re(CO)_5Cl$, dissolved in a solvent such as DI water. Examples of Re oxides include $Re_2O_7$, ammonium rhenate $[NH_4][ReO_4]$, and tetramethyl ammonium rhenate $[(CH_3)_4N][ReO_4]$. The rhenium source may be dissolved in a solvent, such as DI water, and then added to the capping solution in a concentration from about 0.01 g/L to about 50 g/L, preferably from about 0.1 g/L to about 30 g/L of the capping solution.

Complexing agents are preferably added to the capping solution. Complexing agents include carboxylic acids, such as ethylene diamine tetraacetic acid (EDTA), and citric acids such as ammonium citrate and tetramethyl ammonium citrate. For example, in one embodiment, the concentration of ammonium citrate or tetramethyl ammonium citrate is from about 60 g/L to about 90 g/L, and the concentration of EDTA is from about 10 g/L to about 20 g/L of the capping solution.

Buffering compounds are preferably added to the capping solution. In one embodiment, a buffering compound is boric acid ($H_3BO_3$) for maintaining the pH of the solution over time. For example, in one embodiment, the concentration of $H_3BO_3$ is from about 0.5 g/L to about 10 g/L, preferably from about 2 g/L to about 5 g/L of the capping solution. Generally, pH adjusters, such as bases and acids, are added to adjust the pH of the capping solution. Bases used to increase the pH of the capping solution include hydroxides, amines, and hydrides, such as tetramethylammonium hydroxide (TMAH) $(CH_3)_4NOH$, ammonium hydroxide $NH_4OH$, dimethylamine $(CH_3)_2NH$, and combinations thereof. Bases are used to maintain the pH within a pH range of 7 to 12, and preferably a pH within the range of 8 to 10.

Antibacterial and/or antifungal compounds, such as methyl 4-hydroxy benzoic acid, may be added to the capping solution with a concentration from about 10 ppm to about 1,000 ppm, preferably at about 100 ppm. For example, in one embodiment, methyl 4-hydroxy benzoic acid is in the capping solution with a concentration in the range from about 0.001 g/L to about 0.1 g/L, preferably at about 0.01 g/L. Another antibacterial additive is copper sulfate ($CuSO_4$) which may be added to the capping solution having a concentration in the range from about 10 ppb (parts per billion) to about 1,000 ppm.

Surfactants may be added to the capping solution with a concentration from about 10 ppm to about 1,000 ppm, preferably from about 100 ppm to about 500 ppm. For example, in one embodiment, Triton X-100 is added to the capping solution having a concentration in the range from about 0.005 g/L to about 0.5 g/L, preferably from about 0.02 g/L to about 0.04 g/L. In another example, Rhodafac® RE-610 may be added to the capping solution having a concentration in the range from about 0.005 g/L to about 0.5 g/L, preferably from about 0.02 g/L to about 0.04 g/L.

Additives comprising Ca, Al, Ni, and/or Mo, such as accelerators and stabilizers, are added to the capping solution typically in the form of salts and sulfides, to regulate the deposition rate, for lower temperature deposition, and for depositing ultra-thin capping layers having a thickness as low as about 50 Å with low surface roughness. Accelerators increase the deposition rate and are added to the capping solution having a concentration from about 10 ppm to about 1,000 ppm, preferably from about 100 ppm to about 500 ppm. For example, in one embodiment, an accelerator, aluminum sulfate hydrate ($Al_2(SO_4)_3 \cdot 12H_2O$), is in the capping solution with a concentration in the range from about 0.005 g/L to about 1 g/L, preferably from about 0.05 g/L to about 0.3 g/L. This Al-containing additive ($Al_2(SO_4)_3$) can also reduce the temperature of the electroless deposition process to a temperature in the range of about 35° C. to about 55° C. for lower temperature electroless deposition. Stabilizers decrease the deposition rate and are added to the capping solution having a concentration from about 10 ppm to about 1,000 ppm, preferably from about 100 ppm to about 500 ppm. Suitable stabilizers include calcium sulfate ($CaSO_4$) and molybdenum sulfate ($Mo(SO_4)_2$). For example, in one embodiment, calcium sulfate is in the capping solution with a concentration in the range from about 0.005 g/L to about 1 g/L, preferably from about 0.05 g/L to about 0.3 g/L. $CaSO_4$ is also a calcium source when Ca is a desired component of the capping alloy. In another example, molybdenum sulfate is in the capping solution in a concentration in the range from about 0.005 g/L to about 1 g/L, preferably from about 0.05 g/L to about 0.3 g/L. $Mo(SO_4)_2$ is also a molybdenum source when Mo is a desired component of the capping alloy. Another stabilizing additive that may be used is $Pb(NO_3)_2$.

For example, capping solutions having hypophosphorus acid ($H_3PO_2$) as the P source provide capping layer compositions comprising CoWReP having a Re concentration of about 0.5 at % to about 4 at. %. With increased concentrations of $H_3PO_2$ in the capping solution, the capping layer composition may comprise CoWReP having a Re concentration of about 1 at. % and a P concentration of about 12 at. % to about 14 at. %. For capping solutions with a Ca containing P source, such as calcium hypophosphate, small amounts of Ca are incorporated into the capping layer, for example the capping layer composition may be CoWRePCa having a Re concentration of about 2 at. % to about 4 at. %, a P concentration of about 8 at. % to about 12 at. %, and a Ca concentration from about 0.1 at. % to about 1 at. %. Small concentrations of Ca at the capping layer/Cu interconnect interface, further enhance the barrier resistance of the capping layer to reduce Cu mobility at the interface. Similarly, increased P concentrations further increase the barrier resistance of the capping layer to electromigration of the interconnect.

Generally, the conductive surface of the interconnect is exposed to the electroless deposition capping solution for a period in the range from about 5 seconds to about 90 seconds, preferably, from about 20 seconds to about 45 seconds. The capping layer is deposited to a thickness of about 1,000 Å or less, preferably about 50 Å to about 250 Å, and more preferably about 150 Å. The capping solution is usually maintained at a temperature in the range from about 50° C. to about 95° C. and has a pH in the range from about 7 to about 11, preferably, from about 8 to about 10, and more preferably at about 9.

According to another embodiment, FIGS. 2A–2C and FIGS. 3A–3C schematically depict cross-sectional views for forming a two-layer capping layer 40 and 60, respectively, having an interface layer comprising a capping alloy of the invention, at step 110B. As illustrated by interconnects 24a and 24b shown in FIGS. 2A and 2B, a first layer 32 is deposited on the conductive surface of an activation layer 16 by a first electroless process, and a second layer 34 is deposited on the first layer 32 by a second electroless process. After depositing the second layer, the layers are annealed, as described in a later step 118, thereby forming an interface layer 36 comprising the capping alloy of the invention, as depicted in FIG. 2C. The compositions of the first layer and the second layer comprise, collectively, Co, W, Re, and P and/or B such that when the first layer and second layer are annealed, in step 118, an interface layer forms comprising Co, W, Re, and P and/or B. During heating, elemental components from the first layer diffuse into the second layer, and elemental components from the second layer diffuse into the first layer thereby forming an interface layer comprising Co, W, Re, and P and/or B. For example, as illustrated in FIG. 2C, the first layer may comprise Co, Re, and P and the second layer comprise Co, W, and P. During heating in step 118, the elemental components of the CoReP layer diffuse into the COWP layer, and vice versa, thereby forming an interface layer 36 comprising CoWReP. In another example, as illustrated by interconnects 44a and 44b depicted in FIGS. 3A and 3B, the first layer 52 deposited may comprise COWP and the second layer 54 deposited may comprise CoReP, and during heating (in step 118) an interface layer 56 comprising CoWReP is formed as illustrated in FIG. 3C. A wide variety of compositions for the first and second layers may be used, such that when the first and second layers are annealed the interface layer that forms comprises CoWRe and at least one of P and B. For example, a first layer comprising CoRePB and a second layer comprising COWP upon annealing forms an interface layer comprising CoWRePB. In another example, a first layer comprising CoReB and a second layer comprising COWB upon annealing forms an interface layer comprising CoWReB. In still another example, a first layer comprising COWB and the second layer comprising CoReP upon annealing forms an interface layer comprising CoWRePB. The elemental components of the first layer may be selected to increase or optimize the adhesion between the first layer and the particular underlayer such as the surface of the Cu interconnect or the Pd activation layer. Other considerations in selecting the alloy of the first layer are the initiation time for electroless deposition, and selecting an alloy to sufficiently reduce Cu diffusion by anchoring the Cu atoms of the interconnect at the first layer/Cu interconnect interface or by way of the first layer/activation layer interface.

The electroless solutions for forming a two-layer capping layer as depicted in FIGS. 2B and 3B may be formulated comprising pre-mixed manufacturer provided solutions. For example, a COWP capping solution may comprise about 500 mL of 50% MacDermid Disklad 1002B solution (available from MacDermid, Inc. of Waterbury, Conn.), about 30 mL of 3% MacDermid Disklad 1002AM solution, about 40 mL of 4% MacDermid Disklad 1002H, about 1.3 g/L $(NH_4)_2WO_4$, about 0.01 g/L Rhodafac® RE-610, and DI water. The Disklad components of the COWP electroless solution may be mixed per the mixing procedure described for Disklad 1002, as provided by the manufacturer MacDermid, Inc. The $(NH_4)_2WO_4$ component is dissolved in the Disklad 1002B solution by increasing the temperature of the solution from a temperature at about ambient room temperature (25° C.) to about 95° C. while stirring for a period of about 25 minutes to about 60 minutes. The surfactant RE-610 component may be added by stirring the RE-610 in the capping solution for about 30 minutes. Similarly, a CoReP electroless solution may be formulated using pre-mixed manufacturer provided solutions described above, however the $(NH_4)_2WO_4$ component (i.e., W source) of the COWP electroless solution is replaced with a Re source, such as $NH_4ReO_4$. A two-layer capping layer as depicted in FIG. 2B, may be formed by sequentially exposing the Cu interconnections to the a CoReP capping solution and then the COWP capping solution to form a first layer 32 comprising CoReP and a second layer 34 comprising COWP (prior to annealing in step 118), or vice versa as depicted in FIG. 3B wherein the first layer 52 deposited is COWP and the second layer 54 is CoReP.

In an embodiment, an electroless deposition capping solution for forming the capping layer 20 depicted in FIG. 1C may comprise, for example, $CoCl_2.6H_2O$, $CoSO_4$, $(NH_4)_2WO_4$, citric acid (100%), methyl 4-hydroxy benzoic acid, hypophosphorus acid (50%), DMAB, $H_3BO_3$, TMAH (25%), $(NH_4)OH$, Rhodafac® RE-610, and DI water for providing a COWPB volume solution, and a Re additive. The Re additive may optionally comprise P and/or Ca. The electroless volume solution may be pre-mixed in, typically, two to four parts which can be combined to form the volume solution. In a first example, the Re additive generally is a Re source dissolved in a solvent such as water. A Re additive formulation, for example, may include a Re source, TMAH (25%), $(NH_4)OH$, and DI water. The Re source may be a Re salt, Re oxide, and/or Re powder. This Re additive formulation without a reducing agent, is stable and may be added to the volume of COWPB deposition solution for introducing Re atoms into the capping solution.

In another example, the Re additive further comprises a P containing reducing agent. A Re additive with P containing reducing agent formulation, for example, may include a Re source, $COCl_2.6H_2O$, $(NH_4)_2WO_4$, citric acid (100%), methyl 4-hydroxy benzoic acid, hypophosphorus acid (50%), $H_3BO_3$, TMAH (25%), Rhodafac® RE-610, and DI water for providing a CoReP solution that may be added to the COWPB volume solution for introducing Re atoms and increasing the concentration of P for forming a CoWRePB capping layer 20, depicted in FIG. 1C. Alternatively, the Re additive with P containing reducing agent formulation may be used to form a CoReP first layer 32, and the volume solution may be used to form a COWPB second layer 34, as depicted in FIG. 2B. Likewise, the volume solution may be used to form a COWPB first layer 52 and the Re additive with P containing reducing agent formulation may be used to form a CoReP second layer 54, as depicted in FIG. 3B.

In another example, the Re additive further comprises a P and Ca containing reducing agent. A Re additive with P and Ca containing reducing agent formulation, for example, may include a Re source, $CoSO_4$, $(NH_4)_2WO_4$, citric acid (100%), methyl 4-hydroxy benzoic acid, $Ca(H_2PO_4)_2.H_2O$, $H_3BO_3$, $(NH_4)OH$, Rhodafac® RE-610, Triton, and DI water for providing a CoRePCa solution that may be added to the CoWPB volume solution for introducing Re atoms and Ca atoms and increasing the concentration of P for forming a CoWRePBCa capping layer as depicted in FIG. 1C. Alternatively, the Re additive with P and Ca containing reducing agent formulation may be used to form a CoRePCa first layer 32, and the volume solution may be used to form a COWPB second layer 34, as depicted in FIG. 2B. Likewise, the volume solution may be used to form a COWPB first layer 52 and the Re additive with P and Ca containing reducing agent formulation may be used to form a CoRePCa second layer 54, as depicted in FIG. 3B. In addition, Al, Ni, and Mo additives can be added into the formulations of the volume solution or additive solutions, typically in the forms of salts and sulfides, for manipulating the deposition rate, thinning the capping layer thickness to about 50 Å, and increasing the barrier resistance of the capping layer to both copper and oxygen diffusion.

In one example, a CoWReP capping solution may be formulated using pre-mixed manufacturer provided solutions, such as a capping solution comprising about 500 mL of 50% MacDermid Disklad 1002B solution (available from MacDermid, Inc. of Waterbury, Conn.), about 30 mL of 3% MacDermid Disklad 1002AM solution, about 40 mL of 4% MacDermid Disklad 1002H, about 1.3 g/L $(NH_4)_2WO_4$, about 0.01 g/L Rhodafac® RE-610, and DI water for forming a COWP solution, and then adding a Re additive for forming a CoWReP capping solution. The Disklad components of the CoWReP capping solution are mixed per the mixing procedure described for Disklad 1002, as provided by the manufacturer MacDermid, Inc. The $(NH_4)_2WO_4$ component is dissolved in the Disklad 1002B solution by increasing the temperature of the solution from a temperature at ambient room temperature (about 25° C.) to about 95° C. while stirring for a period of about 25 minutes to about 60 minutes. The surfactant RE-610 component may be added by stirring the RE-610 in the capping solution for about 30 minutes.

Following the electroless deposition of the capping layer, either by a single electroless process depicted in FIGS. 1A–1C, or by a first electroless process and a second electroless process as depicted in FIGS. 2A–2C and FIGS. 3A–3C, the substrate surface is rinsed. The rinse step includes washing any remaining capping solution and/or contaminants from the surface with deionized water. The substrate will be rinsed for a period from about 5 seconds to about 60 seconds, preferably from about 15 seconds to about 30 seconds.

At step 112, the substrate surface is cleaned in a post electroless clean aqueous solution comprising citric acid and ammonium hydroxide ($NH_4OH$) for about 5 seconds to about 60 seconds, preferably from about 15 seconds to about 30 seconds. For example, a post electroless clean solution may comprise about 5 g/L citric acid (100%), about 20 mL/L to about 25 mL/L $NH_4OH$, and DI water. In addition, antifungal compounds are preferably added to the post electroless clean solution.

After cleaning, the substrate surface is rinsed in DI water. The rinse step includes washing any remaining post electroless clean solution and/or contaminants from the surface with DI water. The substrate will be rinsed for a period from about 5 seconds to about 60 seconds, preferably from about 15 seconds to about 30 seconds.

At step 114, the substrate typically undergoes a back side and bevel edge clean in an acidic solution to remove metal particulates, such as copper oxides and copper organic complexes. The acidic solution typically comprises acid diluted with water. Acids that may be used include hydrochloric acid, sulfuric acid, acetic acid, nitric acid, hydrofluoric acid, phosphoric acid, and combinations thereof. After cleaning with an acidic solution, the substrate is rinsed with DI water for a period from about 5 seconds to about 60 seconds, preferably from about 15 seconds to about 30 seconds, to remove any remaining acid, acidic residue, and contaminants.

Afterwards, at step 116, the substrate is dried and inspected for defects and uniformity of the layers deposited onto the surface of the substrate. The substrate may be dried in a nitrogen gas ($N_2$) flow, or other gas that does not introduce contaminants onto the surface of the substrate. Optical inspection may be performed using a microscope for visually inspecting any defects such as voids or bridging. Profilometry and atomic force microscopy (AFM) may be used for measuring layer thickness, and measurement techniques such as acoustic reflectance, X-ray reflection, and X-ray fluorescence may be used for measuring layer thickness uniformity.

The substrate is annealed at step 118. The substrate is placed into an annealing chamber and heated to a temperature in the range from about 100° C. to about 300° C., preferably from about 150° C. to about 250° C. In one embodiment, the atmosphere includes a process gas, such as hydrogen ($H_2$), $N_2$, argon (Ar), and combinations thereof, and preferably a mixture of about 10 vol. % $H_2$ and about 90 vol. % $N_2$. The substrate (e.g., wafer) is maintained in this environment for a period in the range of about 5 seconds to about 60 seconds, preferably from about 10 seconds to about 15 seconds. Subsequently, in the same temperature range, the chamber is evacuated to a pressure in the range from about $10^{-3}$ Torr to about $10^{-7}$ Torr for about 1 minute and the substrate is annealed for a period in a range from about 30 seconds to about 5 minutes, preferably from about 1 minute to about 2 minutes.

During annealing of the two-layer capping layer, diffusion between the first layer and the second layer forms an interface layer comprising the capping alloy of the invention. The interface layer forms to a thickness of about 10 Å to about 70 Å, and preferably from about 30 Å to about 50 Å. In general, the higher the annealing temperature, the thicker the interface layer grows. Higher annealing temperatures in the range from about 350° C. to about 500° C. may be employed to further increase the thickness of the interface layer comprising the capping alloy of the invention. Annealing at temperatures in the range of about 400° C. to about 450° C. may be employed to enable complete diffusion of the two-layer capping layer thereby forming a single layer capping layer having a homogeneous composition comprising the capping alloy of the invention.

Annealing stabilizes the capping layer by the re-crystallization and further chemical reduction of the capping alloy which thereby reduces the resistance of the capping layer by about 20% to about 25%, degasses hydrogen, and reduces the oxygen concentration of the capping alloy. Annealing the substrate also stabilizes the capping layer by increasing the adhesion between the capping layer/activation layer or capping layer/metal interconnect. Annealing also stabilizes the low k dielectric layer by degassing ammonium from the low k layer as well as other volatile substances.

The processes described herein are performed in an apparatus suitable for performing electroless deposition processes. Suitable apparatus are generally configured to expose the substrate to an electroless plating solution, wherein the substrate is in a face-up or a face-down configuration. Electroless substrate processing platforms generally include an integrated processing platform having one or more substrate transfer robots, and one or more processing cells or chambers for cleaning (e.g., spin-rinse-dry or bevel clean), annealing, and electrolessly depositing a conductive material onto a substrate in a face-up or a face-down configuration.

Face up-type electroless plating cells generally include a substrate support member configured to support a substrate oriented such that the production surface is face up and a fluid dispensing device configured to provide plating fluids to the production surface of the substrate. The fluid dispensing device may be configured to dispense plating fluids on the surface of the substrate via a dispensing nozzle movably positioned above the surface of the substrate, or alternatively, via a plating evaporation shield positioned above the surface of the substrate that may be used to confine the plating fluid therebetween.

Face down-type electroless plating cells generally include a substrate support member, or head assembly, configured to support a substrate oriented such that the production surface is face down and to move the substrate to a plating fluid provided below the substrate. During deposition, the substrate support member and/or the plating evaporation shield and/or head assembly of the face-up or face-down electroless plating cell, may be rotated or moved to agitate the plating fluid, and furthermore, may be heated to maintain an optimal deposition temperature of the substrate and/or plating fluid. The processing platforms described herein are more fully described in the commonly assigned U.S. Ser.

No. 60/511,236 filed on Oct. 15, 2003, and commonly assigned U.S. Ser. No. 10/036,321, U.S. Pub. No. 2003/0118732, filed on Dec. 26, 2001, and issued as U.S. Pat. No. 6,824,612, both of which are incorporated by reference herein in their entireties.

Figure 5:
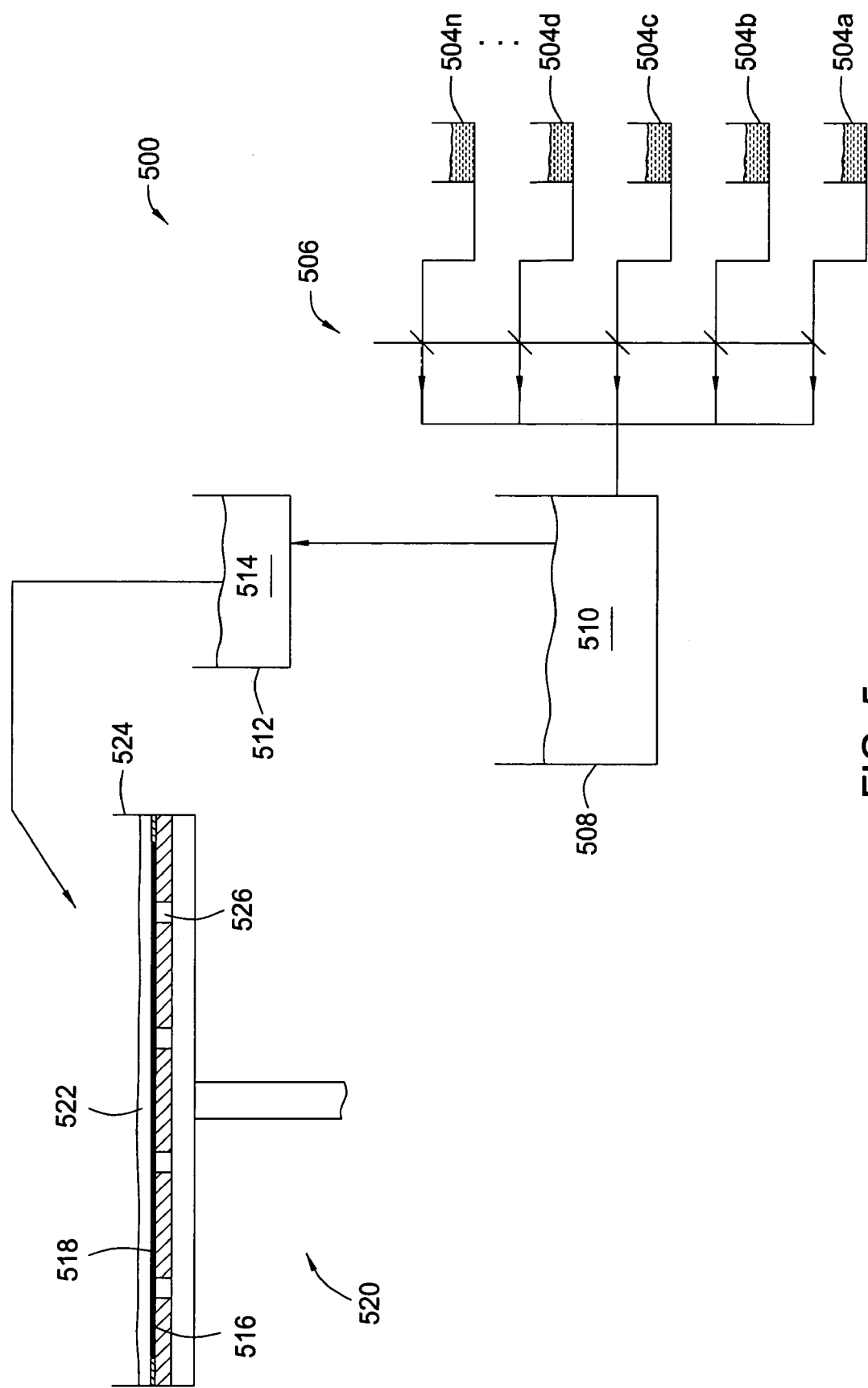
FIG. 5 depicts a schematic view of an exemplary electroless plating system for forming a capping layer, in accordance with various embodiments of the invention.

FIG. 5 generally illustrates a schematic view of an exemplary electroless plating system 500 configured to form a capping layer on a substrate. Fluid sources 504a . . . 504n (504a–504n) contain component fluids that are used to form electroless deposition solutions of the invention. Each of the component fluids are individually metered in a dosing system 506, which generally includes a plurality of selectively actuated valves, and combined prior to delivery to a mixing tank 508. The dosing system 506 meters the volume of each component fluid at about ambient room temperature (e.g., 25° C.). For example, for forming an electroless solution of the invention, fluid source 504a may contain a reducing agent, such as a phosphorus-containing or boron-containing reducing agent, fluid source 504b may contain a cobalt source and a complexing agent (e.g., citric acid), fluid source 504c may contain a tungsten source with or without a complexing agent, fluid source 504d may contain a rhenium source, with or without a complexing agent, and one or more additives such as stabilizer, accelerator, Ca, P, B, Al, Ni, and Mo, and fluid source 504e may contain a pH adjustor.

In the mixing tank 508, the electroless solution 510 is conditioned by mixing, heating, and degassing the electroless solution 510 prior to delivery to a reservoir 512. Mixing the electroless solution 510 may be conducted by conventional means, such as stirring with a stirrer (not shown) disposed within the mixing tank 508, agitating, or other mixing means known in the art. The electroless solution 510 is activated by heating the electroless solution 510 to a temperature in the range of between about 65° C. and about 95° C., preferably about 85° C., to drive out oxygen dissolved in the electroless solution 510 prior to deposition. Heating to a temperature of about 85° C. (i.e., a temperature about 10° C. higher than the temperature of the electroless solution at deposition) assists in mixing and reduces the amount of oxygen dissolved in the electroless solution 510 due to exposure to atmosphere (e.g., air) and also generated, in part, by chemical reactions occurring in the electroless solution 510. In addition, a gas may be bubbled through the electroless solution 510 to reduce the concentration of oxygen in the electroless solution 510. Suitable gases for bubbling include forming gas ($N_2/H_2$), $H_2$, Ar, $N_2$, He, or combinations thereof. The component fluids contained in fluid sources 504a–504n may be independently added to the electroless solution 510, using the dosing system 506, to adjust the composition of the electroless solution 510. The electroless solution 510 is conditioned for a period of between about 30 minutes and about 90 minutes, preferably about 60 minutes, until the electroless solution 510 reaches a steady state composition which is then delivered to the reservoir 512.

In the reservoir 512, a stable electroless solution 514 is heated to a temperature in the range of between about 65° C. and about 80° C., preferably between about 70° C. and about 75° C., to maintain the stable electroless solution 514 at a constant and optimal deposition processing temperature prior to dispensing electroless solution 514 over a substrate 516 (e.g., wafer). The reservoir 512 may be sized to accommodate a predetermined volume or small dose of the electroless solution 514 to dispense over a substrate 516, for example, a volume of between about 200 mL and about 300 mL. Alternatively, reservoir 512 may be sized to contain a volume of electroless solution 514, for example, between about 0.5 L and about 3 L for processing multiple substrates (e.g., 5 to 20 wafers) which may be generally arranged in a stack or side-by-side in a plane.

In an embodiment, the predetermined volume of electroless solution 514, or a portion thereof, is dispensed onto a top surface 518 of the substrate 516 which is mounted on a pedestal 520, thereby forming a layer of electroless solution 522 adjacent the top surface 518 of the substrate and contained in a lateral direction by a wall 524 of the pedestal 520. The layer of electroless solution 522 may have a thickness in the range of between about 0.5 mm and about 5 mm, preferably between about 1.5 mm and about 2.5 mm. The substrate 516 may be held in position by a vacuum in communication with the backside of the substrate 516 through apertures 526 in the pedestal 520. The pedestal 520 is heated for maintaining the top surface 518 of the substrate at the optimal processing temperature in the range of between about 65° C. and about 80° C., preferably between about 70° C. and about 75° C. The pedestal 520 may be heated by conventional means including, for example, a resistive heating element disposed therein (not shown). The deposition process may be carried out by immersion, spin-on, and other conventional methods, to form a capping layer of the invention (e.g., CoWRePB) on the substrate 516 or the conductive surface of one or more interconnects therein. Preferably, the deposition process is carried out under hydrodynamic conditions such that there is relative motion between the substrate 516 and the electroless solution 522 for enhancing reaction at the interface between the electroless solution 522 and the top surface 518 of the substrate by providing fresh reactants thereto. The electroless plating system 500 may also be used to form a multilayer capping layer by dispensing a first electroless solution to form a first layer (e.g., COWP) on the substrate 516 and subsequently dispensing a second electroless solution to form a second layer (e.g., CoReB) on the substrate or over the first layer.

Figure 6:
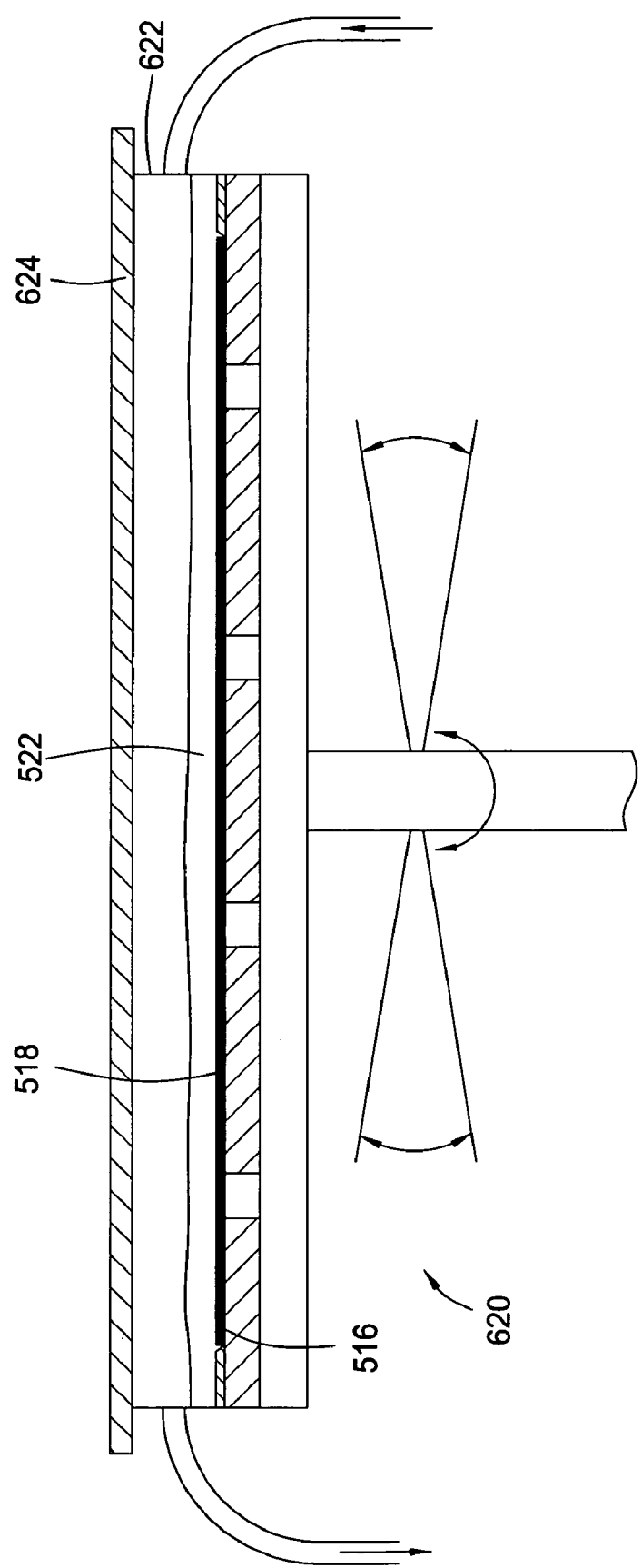
FIG. 6 schematically depicts a cross-sectional view of an exemplary pedestal for electroless plating, in accordance with an embodiment of the invention.

In another embodiment, the deposition process is carried out under hydrodynamic conditions, as illustrated in FIG. 6, wherein a pedestal 620 is oscillated to provide relative motion between the substrate 516 and the electroless solution 522. Oscillating the pedestal 620 agitates and/or circulates the electroless solution 522 to provide fresh reactants to the top surface 518 of the substrate. The pedestal 620 may be oscillated back and forth by rotating the pedestal 620 clockwise between about 20 degrees and about 60 degrees, preferably between about 30 degrees and about 40 degrees, and then rotating the pedestal 620 counterclockwise between about 20 degrees and about 60 degrees, preferably between about 30 degrees and about 40 degrees. The frequency of back and forth rotation (oscillation cycle) may be optimized for a particular system, however it is generally a frequency in the range of between about 5 cycles/minute and about 20 cycles/minute. The electroless solution 522 may be supplied and drained through apertures in a side wall 622 of the pedestal 620. The pedestal 620 is heated for maintaining the top surface 518 of the substrate at an optimal processing temperature in the range of between about 65° C. and about 80° C., preferably between about 70° C. and about 75° C. The pedestal 620 may be heated by conventional means including, for example, a resistive heating element disposed therein (not shown). In addition, a removable cover 624 is positioned above the substrate 516 for shielding against loss of electroless solution 522. The removable cover 624 is preferably heated to assist in maintaining the electroless solution 522 at a uniform and optimal temperature for deposition in the range of between about 65° C. and about 80° C., preferably between about 70° C. and about 75° C. The removable cover 624 may be heated by conventional means including, for example, a resistive heating element disposed therein (not shown).

While the foregoing is directed to embodiments of the invention, other and further embodiments of the invention may be devised without departing from the basic scope thereof, and the scope thereof is determined by the claims that follow.

DESCRIPTION OF REFERENCE NUMERALS

Interconnects 4a, 4b, 4c, 24a, 24b, 44a, 44b
Conductive Fill Materials 6
Interconnect Opening 8
Low-K Dielectric Material 10
Liner Barrier Material 12
Activation Layer 16
Capping Layers 20, 40, 60
First Layers 32, 52
Second Layers 34, 54
Interface Layers 36, 56
Interconnects 4c, 24c, 44c
Electroless Plating System 500
Fluid Sources 504a–504n
Dosing System 506
Mixing Tank 508
Electroless Solution 510
Reservoir 512
Stable Electroless Solution 514
Substrate 516
Surface 518
Pedestal 520
Electroless Solution 522
Wall 524
Apertures 526
Pedestal 620
Side Wall 622
Cover 624

The invention claimed is:

1. A method for fabricating a capping layer with enhanced barrier properties, comprising:
   forming a capping layer on a conductive surface of an interconnect, wherein the capping layer comprises cobalt, tungsten, rhenium, calcium, and at least one element selected from the group consisting of phosphorus and boron, and annealing the capping layer.

2. The method of claim 1, wherein the capping layer comprises a rhenium concentration of within a range from about 0.1 atomic % to about 10 atomic %.

3. The method of claim 2, wherein the rhenium concentration is within a range of from about 0.5 atomic % to about 4 atomic %.

4. The method of claim 1, wherein the capping layer comprises a phosphorus concentration of less than about 20 atomic %.

5. The method of claim 4, wherein the phosphorus concentration is within a range from about 8 atomic % to about 15 atomic %.

6. The method of claim 1, wherein the capping layer further comprises at least one element selected from the group consisting of aluminum, nickel, and molybdenum.

7. The method of claim 1, wherein the capping layer comprises crystalline grains and grain boundaries, wherein the grain boundaries comprise rhenium.

8. The method of claim 1, wherein the conductive surface comprises at least one element selected from the group consisting of copper, palladium, silver, cobalt, gold, nickel, zinc, platinum, and tin.

9. The method of claim 1, wherein the forming a capping layer comprises depositing the capping layer by exposing the conductive surface to an electroless capping solution comprising a cobalt source, a tungsten source, a rhenium source, a calcium source, and at least one elemental source selected from the group consisting of a phosphorus source and a boron source.

10. The method of claim 9, wherein the electroless capping solution further comprises a complexing agent, a phosphorus-containing or boron-containing reducing agent, and at least one additive selected from the group consisting of a pH adjuster, a buffering agent, a base, a surfactant, and an antifungal compound.

11. The method of claim 9, wherein the electroless capping solution comprises from about 0.01 g/L to about 50 g/L of the rhenium source and from about 5 g/L to about 80 g/L of the phosphorus source to form a capping layer comprising CoWReP wherein the capping layer comprises a rhenium concentration within a range from about 0.1 atomic % to about 10 atomic % and a phosphorus concentration within a range from about 8 atomic % to about 20 atomic %.

12. The method of claim 9, wherein the electroless capping solution comprises:
   from about 1 g/L to about 100 g/L of the cobalt source, wherein the cobalt source comprises $CoCl_2$, $CoSO_4$, or combinations thereof;
   from about 0.01 g/L to about 50 g/L of the tungsten source, wherein the tungsten source comprises $CaWO_4$, $(NH_4)_2WO_4$, $H_2WO_4$, or combinations thereof;
   from about 0.01 g/L to about 50 g/L of the rhenium source, wherein the rhenium source comprises Re, $ReCl_3$, $ReCl_5$, $Re(CO)_5Br$, $Re(CO)_5Cl$, $Re_2O_7$, $[NH_4][ReO_4]$, $[(CH_3)_4N][ReO_4]$, or combinations thereof;
   from about 5 g/L to about 80 g/L of the phosphorus source, wherein the phosphorus source comprises $H_3PO_2$, $Ca(H_2PO_4)_2$, $CaHPO_4$, $Ca_{10}(OH)_2(PO_4)_6$, $(NH_4)_3PO_2$, or combinations thereof, and/or from about 1 g/L to about 50 g/L of the boron source, wherein the boron source comprises $(CH_3)_2NH.BH_3$;
   from about 60 g/L to about 90 g/L of ammonium citrate and/or tetramethyl ammonium citrate, or from about 10 g/L to about 20 g/L of ethylene diamine tetra acetic acid as a complexing agent;
   from about 0.5 g/L to about 10 g/L of $H_3BO_3$, and/or a pH adjuster selected from the group consisting of $(CH_3)_4NOH$, $NH_4OH$, $(CH_3)_2NH$, and combinations thereof;
   water; and
   from about 0.005 g/L to about 1 g/L of a surfactant, a stabilizer, or combinations thereof.

13. The method of claim 9, wherein the electroless capping solution further comprises at least one elemental source selected from the group consisting of an aluminum source, a nickel source, and a molybdenum source.

14. The method of claim 13, wherein the calcium source comprises $CaSO_4$, $CaWO_4$, $Ca(H_2PO_4)_2$, $CaHPO_4$, $Ca_{10}(OH)_2(PO_4)_6$, or combinations thereof, the aluminum source comprises $Al_2(SO_4)_3$, and the molybdenum source comprises $Mo(SO_4)_2$.

15. The method of claim 9, wherein the forming a capping layer further comprises depositing an activation layer on the conductive surface prior to depositing the capping layer, wherein the activation layer comprises at least one element selected from the group consisting of palladium, silver, cobalt, gold, nickel, zinc, platinum, and tin.

16. The method of claim 1, wherein the forming a capping layer comprises:
   electrolessly depositing a multilayer capping layer; and
   annealing the multilayer capping layer thereby forming an interface layer therein, wherein the interface layer comprises cobalt, tungsten, rhenium, and at least one element selected from the group consisting of phosphorus and boron.

17. The method of claim 16, wherein the interface layer comprises a rhenium concentration within a range from about 0.1 atomic % to about 10 atomic %.

18. The method of claim 16, wherein the electrolessly depositing a multilayer capping layer comprises sequentially exposing the conductive surface to a first electroless capping solution and a second electroless capping solution.

19. A method for fabricating a capping layer with enhanced barrier properties, comprising:
   forming a capping layer on a conductive surface of an interconnect, wherein the capping layer comprises cobalt, tungsten, rhenium, and at least one element selected from the group consisting of phosphorus and boron;
   depositing a multilayer capping layer by sequentially exposing the conductive surface to a first electroless capping solution and a second electroless capping solution, wherein the first electroless capping solution comprises cobalt, rhenium, and at least one element selected from the group consisting of phosphorus and boron, for forming a first layer comprising CoReP, CoReB, or CoRePB, and wherein the second electroless capping solution comprises cobalt, tungsten, and at least one element selected from the group consisting of phosphorus and boron, for forming a second layer comprising CoWP, CoWB, or CoWPB.

20. A method for fabricating a capping layer with enhanced barrier properties, comprising:
   forming a capping layer on a conductive surface of an interconnect, wherein the capping layer comprises cobalt, tungsten, rhenium, and at least one element selected from the group consisting of phosphorus and boron;
   depositing a multilayer capping layer by sequentially exposing the conductive surface to a first electroless capping solution and a second electroless capping solution, wherein the first electroless capping solution comprises cobalt, tungsten, and at least one element selected from the group consisting of phosphorus and tungsten, for forming a first layer comprising CoWP, CoWB, or CoWPB, and wherein the second electroless capping solution comprises cobalt, rhenium, and at least one element selected from the group consisting of phosphorus and boron, for forming a second layer comprising CoReP, CoReB, or CoRePB.

21. The method of claim 16, wherein the conductive surface comprises at least one element selected from the group consisting of copper, palladium, silver, cobalt, gold, nickel, zinc, platinum, and tin.

22. The method of claim 16, wherein the forming a capping layer further comprises depositing an activation layer on the conductive surface prior to electrolessly depositing the multilayer capping layer, wherein the activation layer comprises at least one element selected from the group consisting of palladium, silver, cobalt, gold, nickel, zinc, platinum, and tin.

23. A process for fabricating a capping layer with enhanced barrier properties on a conductive surface, comprising:
   pre-cleaning the conductive surface;
   depositing an activation layer on the conductive surface;
   electrolessly depositing a capping layer on the activation layer, wherein the capping layer comprises cobalt, tungsten, rhenium calcium, and phosphorus; and
   annealing the capping layer.

24. The process of claim 23, wherein the pre-cleaning the conductive surface comprises exposing the conductive surface to a pre-cleaning solution, wherein the pre-cleaning solution comprises water, a surfactant, and at least one acid selected from the group consisting of sulfuric acid and hydrochloric acid.

25. The process of claim 23, wherein the depositing an activation layer comprises exposing the conductive surface to an activation solution comprising at least one elemental source selected from the group consisting of a palladium source, a silver source, a cobalt source, a gold source, a nickel source, a zinc source, a platinum source, and a tin source.

26. The process of claim 25, wherein the activation solution comprises water, at least one palladium source selected from the group consisting of $PdCl_2$, $PdSO_4$, and Pd acetate, and at least one acid selected from the group consisting of hydrochloric acid, sulfuric acid and hydrofluoric acid.

27. The process of claim 23, wherein the electrolessly depositing a capping layer on the activation layer comprises exposing the activation layer to an electroless capping solution comprising a cobalt source, a tungsten source, a rhenium source, a calcium source, and a phosphorus source, and wherein the annealing the capping layer comprises heating the capping layer to a temperature within a range of about 100° C. to about 300° C.

28. A process for fabricating a capping layer with enhanced barrier properties on a conductive surface, comprising:
   pre-cleaning the conductive surface;
   depositing an activation layer on the conductive surface;
   electrolessly depositing a capping layer on the activation layer, wherein the capping layer comprises cobalt, tungsten, rhenium, and at least one element selected from the group consisting of phosphorus and boron; and
   annealing the capping layer, wherein the electrolessly depositing the capping layer on the activation layer comprises sequentially exposing the activation layer to a first electroless capping solution for forming a first layer and a second electroless capping solution for forming a second layer, the first electroless capping solution comprising a cobalt source, a rhenium source, and at least one elemental source selected from the group consisting of a phosphorus source and a boron source, the second electroless capping solution comprising a cobalt source, a tungsten source, and at least one elemental source selected from the group consisting of a phosphorus source and a boron source, and wherein the annealing the capping layer comprises heating the first layer and the second layer to a temperature within a range of about 100° C. to about 300° C. thereby forming an interface layer comprising cobalt, tungsten, rhenium, and at least one element selected from the group consisting of phosphorus and boron.

29. A process for fabricating a capping layer with enhanced barrier properties on a conductive surface, comprising:

pre-cleaning the conductive surface;

depositing an activation layer on the conductive surface;

electrolessly depositing a capping layer on the activation layer, wherein the capping layer comprises cobalt, tungsten, rhenium, and at least one element selected from the group consisting of phosphorus and boron; and annealing the capping layer, wherein the electrolessly depositing the capping layer on the activation layer comprises sequentially exposing the activation layer to a first electroless capping solution for forming a first layer and a second electroless capping solution for forming a second layer, the first electroless capping solution comprising a cobalt source, a tungsten source, and at least one elemental source selected from the group consisting of a phosphorus source and a boron source, the second electroless capping solution comprising a cobalt source, a rhenium source, and at least one elemental source selected from the group consisting of a phosphorus source and a boron source, and wherein the annealing the capping layer comprises heating the first layer and the second layer to a temperature within a range of about 100° C. to about 300° C. thereby forming an interface layer comprising cobalt, tungsten, rhenium, and at least one element selected from the group consisting of phosphorus and boron.

* * * * *

UNITED STATES PATENT AND TRADEMARK OFFICE
CERTIFICATE OF CORRECTION

PATENT NO. : 7,205,233 B2
APPLICATION NO. : 10/703769
DATED : April 17, 2007
INVENTOR(S) : Lopatin et al.

It is certified that error appears in the above-identified patent and that said Letters Patent is hereby corrected as shown below:

In Item (56) References Cited:

In the U.S. Patent Documents, on Page 2, please delete "2002/0098981" and insert --2002/0098681--.

In the Specification:

In Column 2, Line 8, please delete "COWP" and insert --CoWP--;

In Column 2, Line 8, please delete "COWPB" and insert --CoWPB--;

In Column 6, Line 36, please delete "$COCl_2.6H_2O$" and insert --$CoCl_2.6H_2O$--;

In Column 6, Line 37, please delete "$COSO_4.7H_2O$" and insert --$CoSO_4.7H_2O$--;

In Column 6, Line 63, please delete "$(CH_3)_2NHoBH_3$" and insert --$(CH_3)_2NH.BH_3$--;

In Column 9, Line 6, please delete "COWP" and insert --CoWP--;

In Column 9, Line 10, please delete "COWP" and insert --CoWP--;

In Column 9, Line 18, please delete "COWP" and insert --CoWP--;

In Column 9, Line 20, please delete "COWB" and insert --CoWB--;

In Column 9, Line 23, please delete "COWB" and insert --CoWB--;

In Column 9, Line 37, please delete "COWP" and insert --CoWP--;

In Column 9, Line 43, please delete "COWP" and insert --CoWP--;

In Column 9, Line 56, please delete "COWP" and insert --CoWP--;

In Column 9, Line 60, please delete "COWP" and insert --CoWP--;

In Column 9, Line 63, please delete "COWP" and insert --CoWP--;

In Column 9, Line 67, please delete "$COSO_4$" and insert --$CoSO_4$--;

In Column 10, Line 4, please delete "COWPB" and insert --CoWPB--;

In Column 10, Line 14, please delete "COWPB" and insert --CoWPB--;

UNITED STATES PATENT AND TRADEMARK OFFICE
CERTIFICATE OF CORRECTION

PATENT NO. : 7,205,233 B2
APPLICATION NO. : 10/703769
DATED : April 17, 2007
INVENTOR(S) : Lopatin et al.

It is certified that error appears in the above-identified patent and that said Letters Patent is hereby corrected as shown below:

In the Specification: (cont'd)

In Column 10, Line 19, please delete "$COCL_2.6H_2O$" and insert --$CoCL_2.6H_2O$--;

In Column 10, Line 23, please delete "COWPB" and insert --CoWPB--;

In Column 10, Line 28, please delete "COWPB" and insert --CoWPB--;

In Column 10, Line 30, please delete "COWPB" and insert --CoWPB--;

In Column 10, Line 36, please delete "$COSO_4$" and insert --$CoSO_4$--;

In Column 10, Line 46, please delete "COWPB" and insert --CoWPB--;

In Column 10, Line 47, please delete "COWPB" and insert --CoWPB--;

In Column 10, Line 65, please delete "COWP" and insert --CoWP--;

In Column 14, Line 35, please delete "COWP" and insert --CoWP--.

In the Claims:

In Column 15, Claim 2, Line 51, please delete "of";

In Column 15, Claim 3, Line 54, please delete "of";

In Column 18, Claim 23, Line 8, please delete "rhenium calcium" and insert --rhenium, calcium--.

Signed and Sealed this

Tenth Day of July, 2007

JON W. DUDAS
*Director of the United States Patent and Trademark Office*